(12) United States Patent
Sanduleanu

(10) Patent No.: US 7,271,672 B2
(45) Date of Patent: Sep. 18, 2007

(54) VOLTAGE CONTROLLED LC TANK OSCILLATOR

(75) Inventor: Mihai Adrian Tiberiu Sanduleanu, Eindhoven (NL)

(73) Assignee: NXP B.V., Eindhoven (NL)

( * ) Notice: Subject to any disclaimer, the term of this patent is extended or adjusted under 35 U.S.C. 154(b) by 5 days.

(21) Appl. No.: 10/527,946

(22) PCT Filed: Aug. 6, 2003

(86) PCT No.: PCT/IB03/03492

§ 371 (c)(1),
(2), (4) Date: Mar. 15, 2005

(87) PCT Pub. No.: WO2004/027977

PCT Pub. Date: Apr. 1, 2004

(65) Prior Publication Data

US 2006/0006954 A1 Jan. 12, 2006

(30) Foreign Application Priority Data

Sep. 17, 2002 (EP) .................................. 02078816

(51) Int. Cl.
*H03B 5/08* (2006.01)
(52) U.S. Cl. ............ 331/167; 331/117 R; 331/117 FE; 331/74
(58) Field of Classification Search ............ 331/117 R, 331/167, 177 V, 117 FE, 74; 455/260
See application file for complete search history.

(56) References Cited

U.S. PATENT DOCUMENTS

| 4,706,045 A | 11/1987 | Hull et al. |
| 6,198,360 B1 | 3/2001 | Henrion |
| 6,683,509 B2 * | 1/2004 | Albon et al. ............ 331/177 V |

* cited by examiner

*Primary Examiner*—Arnold Kinkead
(74) *Attorney, Agent, or Firm*—Peter Zawilski

(57) ABSTRACT

Voltage controlled oscillator comprising a LC tank circuit (L, C, R) coupled to modulator means and characterized in that the modulator means are coupled to amplifier means via an adder for generating a quadrature periodical output signal having a frequency in a relative wide range, the frequency being controlled by a control signal ($V_T$) provided to the modulator means.

15 Claims, 4 Drawing Sheets

VOLTAGE CONTROLLED LC TANK OSCILLATOR

Figure 1:
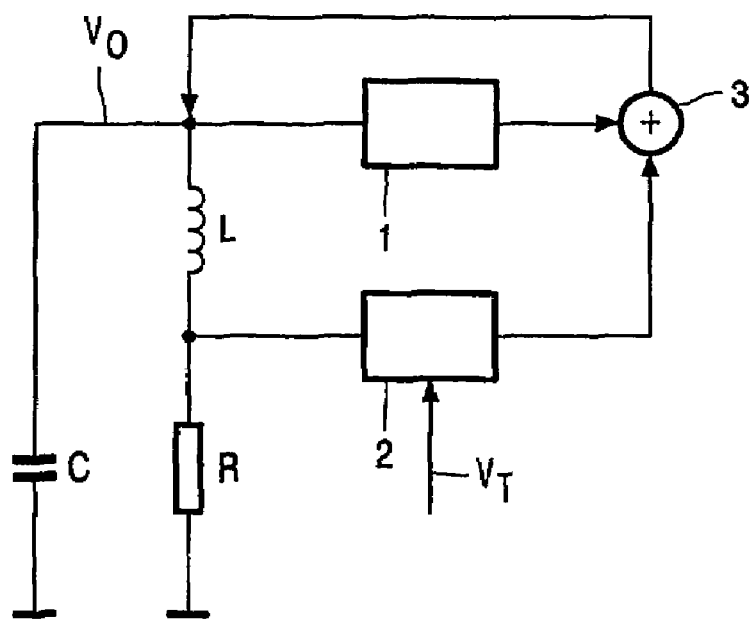

The invention relates to a voltage-controlled oscillator comprising a LC tank circuit coupled to modulator means. The invention also relates to a phase locked loop including such an oscillator.

The need for generation of quadrature signals for wireless and optical transceivers within a large frequency range comes from the low IF/zero IF architectures for wireless and architectures for optical receivers. In order to cover different standards with the same oscillator the oscillator should be tunable over a large frequency range. When octave tuning is possible simple frequency dividers based on two D flip-flops could be used and any frequency below the oscillation frequency of the VCO could be synthesized. This simplifies a lot the divider architecture and reduces power consumption. Usually, the price paid is the need for RC oscillators since they are tunable in a wide range. LC oscillators have better phase noise than RC oscillators but are tunable in a smaller range. The state of the art LC oscillators with large tuning range are based on two LC tanks with either an interpolation mechanism among the two or a ring construction, which could be seen as a combination of a RC and a LC oscillator. The latest construction provides quadrature outputs at the oscillation frequency but they are not tunable in a wide frequency range e.g. at least an octave.

U.S. Pat. No. 6,198,360 discloses a circuit and a method used in LC or ring oscillators. A frequency of oscillation of the oscillator may be modulated by detecting a quadrature signal and controlling the sign and magnitude of the quadrature signal that may be feedback to the oscillator to cause the oscillator to run either faster or slower (dependent on the sign of the quadratic signal) than the unmodulated oscillator. The circuit comprises a cross-coupled pair of transistors for implementing a negative resistance necessary for frequency generation. A LC circuit determines the oscillation frequency. Two capacitors C1, C2 and two resistors R1, R2 are provided for obtaining quadrature oscillation for the oscillation. It is observed that a differential voltage VCONN, VCONP, controls the frequency of the oscillation. It is further observed that the oscillation includes a combination of a LC oscillator having a feedback control loop comprising RC components that increase phase noise of the oscillator and therefore the phase noise could not be decreased because the RC components are necessary for generation of quadrature output signals.

It is therefore an object of the present invention to present a voltage-controlled oscillator having a relatively wide range of oscillation and a relatively low phase noise.

In accordance with the invention this is achieved in an oscillator as described in the introductory paragraph characterized in that the modulator means are coupled to amplifier means via an adder for generating a quadrature periodical output signal having a frequency in a relative wide range, the frequency being controlled by a control signal provided to the modulator means. The LC tank circuit has a resonance frequency that determines an oscillation frequency of the oscillator that could be modified either by modifying a capacity in the LC tank circuit and/or by the control signal provided to the modulator. The LC tank circuit comprises a series connection of an inductor and a resistor coupled in parallel to a capacitor. When relatively high oscillation frequencies are generated e.g. GHz the inductor has a relatively high quality factor and a voltage across the resistor is in quadrature with respect a voltage across the LC tank circuit and therefore the oscillator generates quadrature signals. A feedback signal obtained via the adder is used for sustaining the oscillation of the oscillator.

In an embodiment of the invention the modulator means comprises a series coupling of a buffer and a modulator. The buffer has normally relatively high input impedance and therefore isolates the LC tank circuit from the modulator. Hence, the mixer does not influence quality factor of the LC tank circuit and therefore it's resonance frequency.

In another embodiment of the invention the amplifier means comprise a series coupling of an another buffer and an amplifier. Whenever it is possible, a relatively high input impedance buffer is provided for better isolating the LC tank circuit from the rest of the circuits. Hence, both the LC tank circuit and the amplifier means work in a more relaxed conditions in terms of currents and voltages. When relatively high frequencies are generated, the amplifier could be a transconductance amplifier. Transconductance amplifiers amplify a voltage-type input signal and generate a current-type output signal. Current-type signals are very suitable to be used in relatively high frequency systems a therefore a transconductance amplifier may be used in generation of relatively high frequency signals.

In an embodiment of the invention the amplifier means is a transconductance amplifier, the modulator means is a Gilbert cell modulator and the adder is a node. In this current-mode arrangement the adder has the simplest structure i.e. a node and the oscillator may be implemented with a minimum number of passive components i.e. resistors, capacitors, inductors and active components i.e. transistors, amplifiers. Hence, when integrated in the same chip the circuit occupies a relatively reduced area.

Because the oscillator has a relatively large tuning range it could be used in many application. In a preferred embodiment the oscillation according to the invention is used in a TV tuner having a large tuning range. Modern tuners normally comprise a phase locked loop, the loop having a voltage-controlled oscillator that is used for locking on a tuned frequency. In order to cover wide frequency range input signals, a wide-range voltage-controlled oscillator is necessary and therefore the oscillator according to the present invention may be used.

Figure 2:
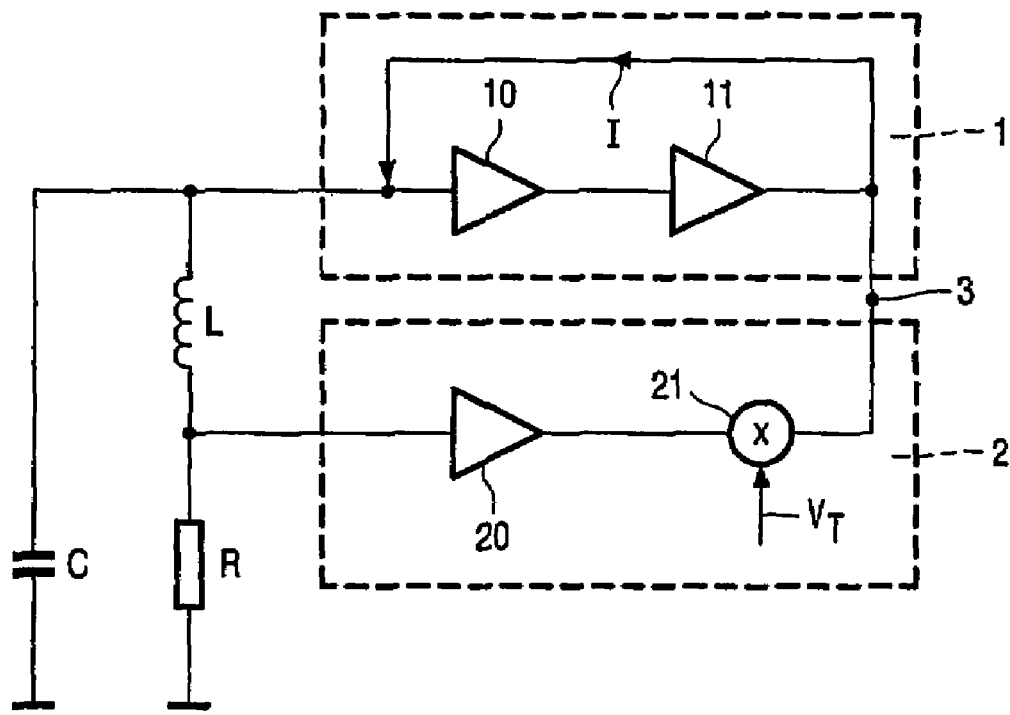
Figure 3:
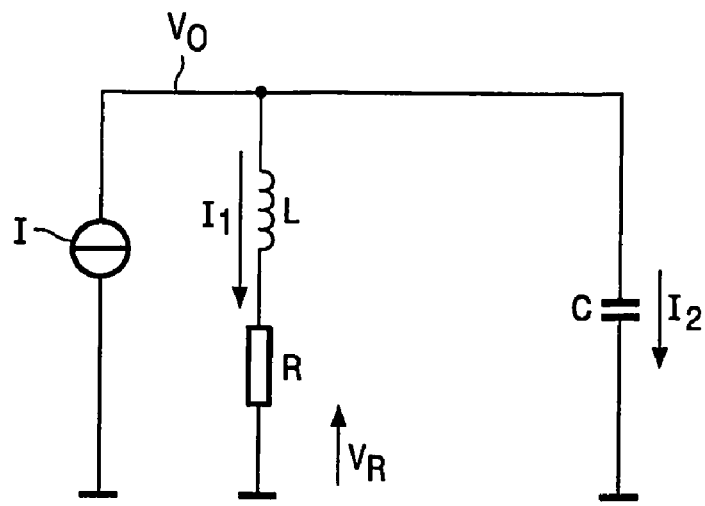
Figure 4:
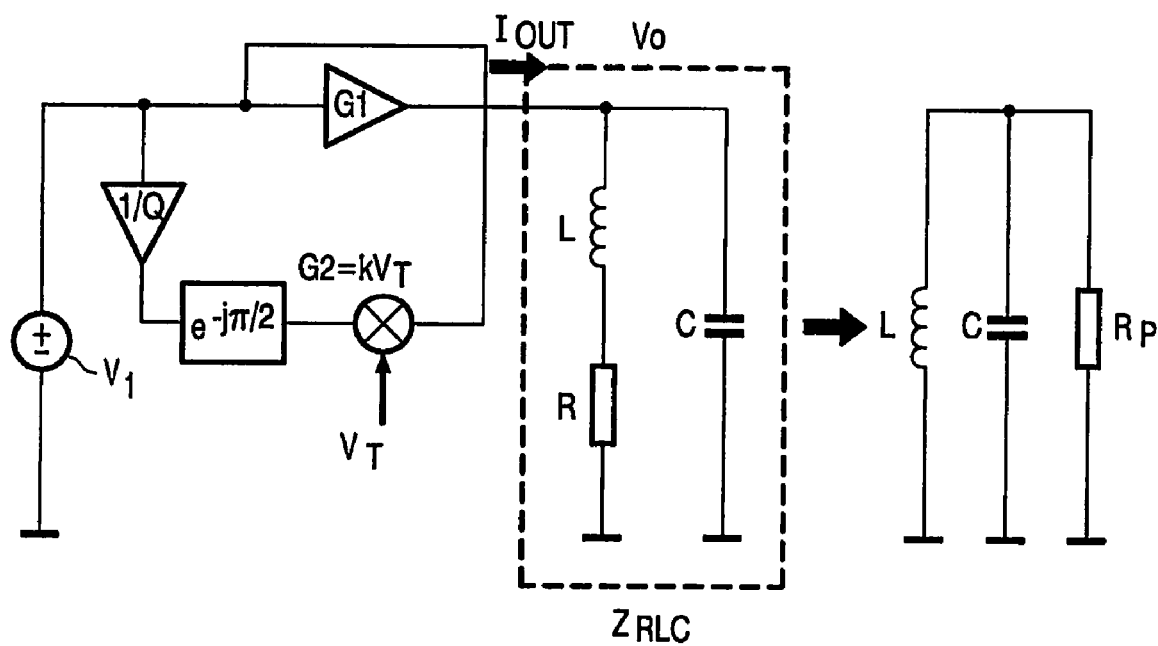
Figure 5:
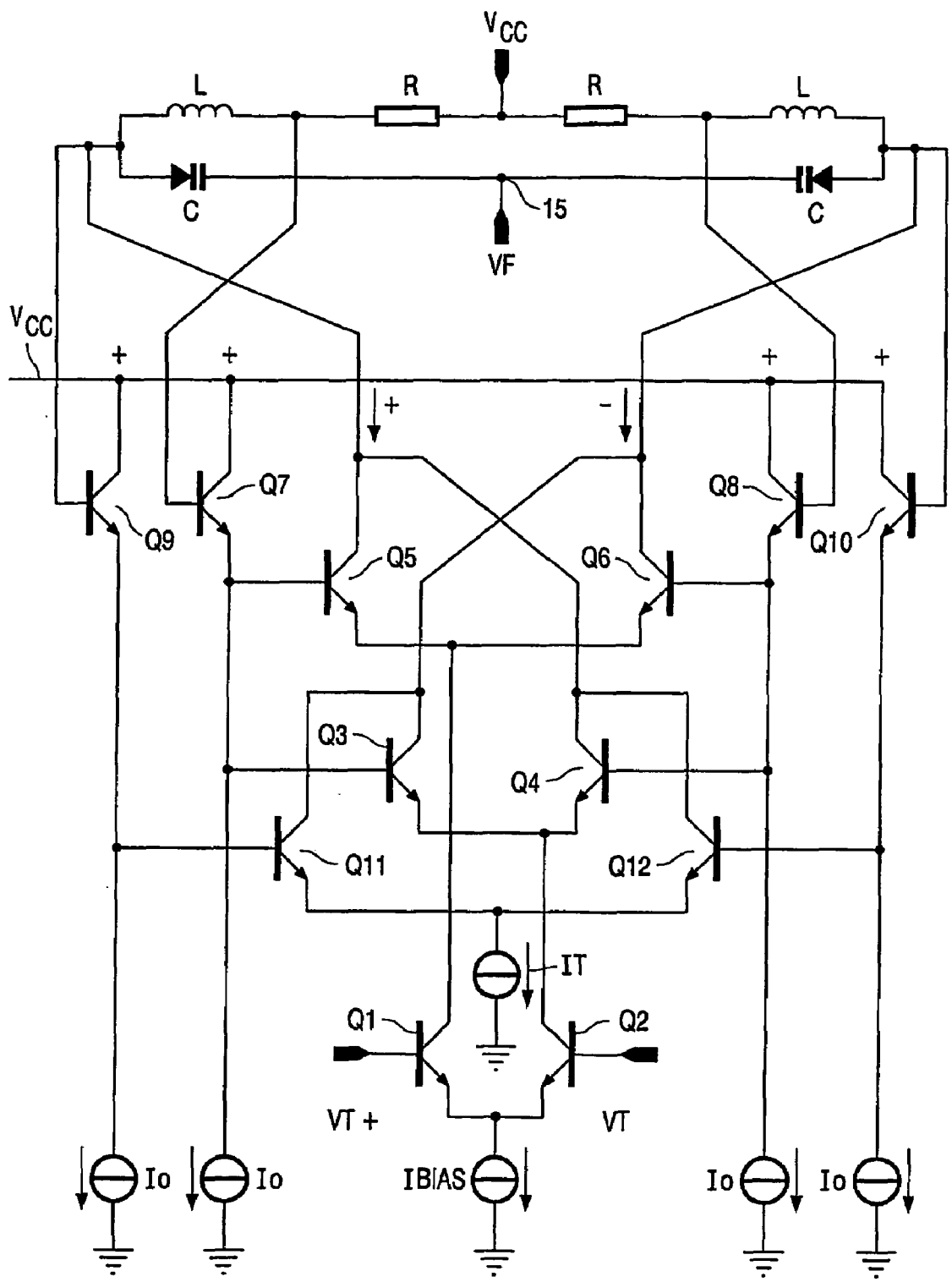
Figure 6:
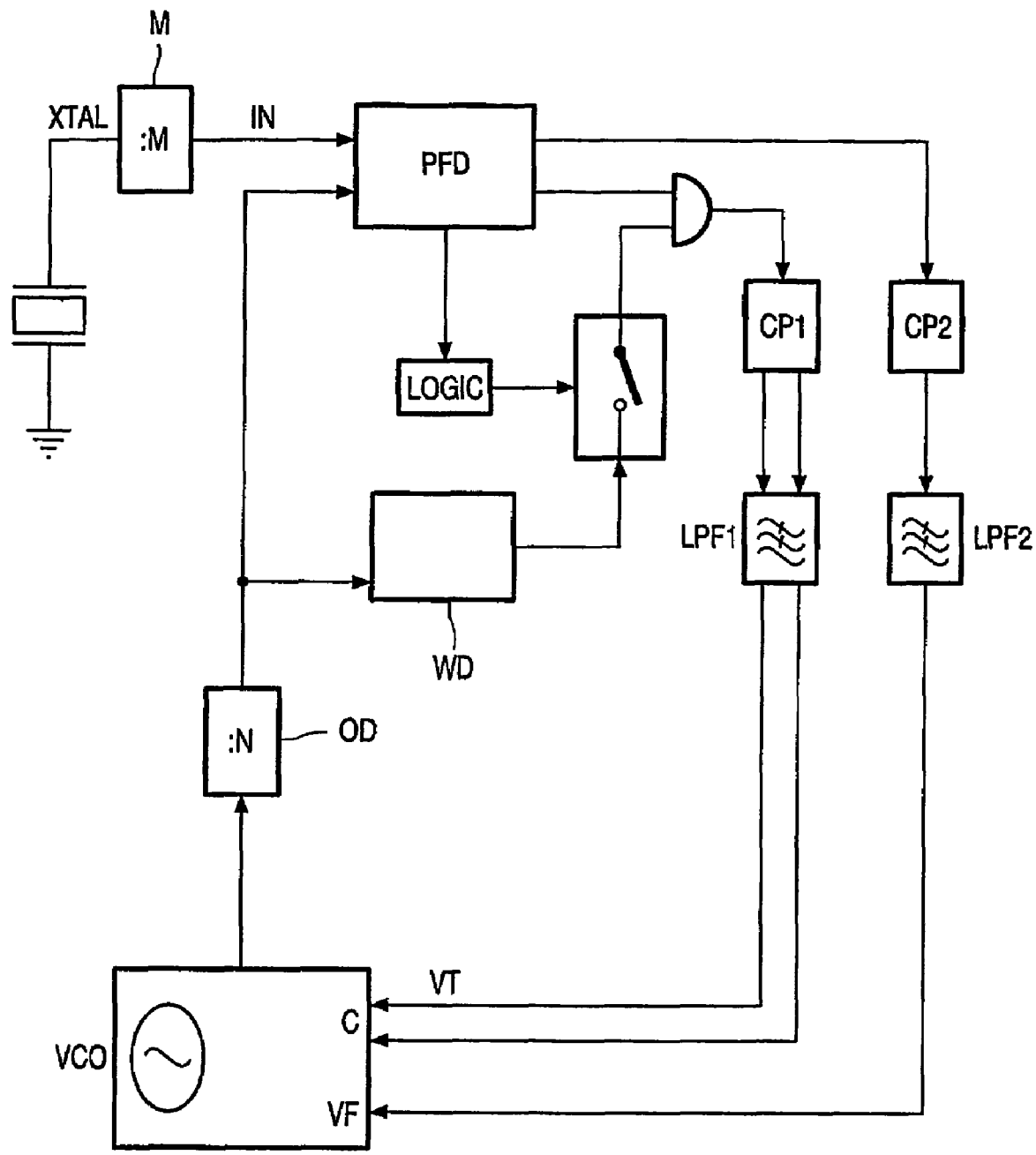

The above and other features and advantages of the invention will be apparent from the following description of the exemplary embodiments of the invention with reference to the accompanying drawings, in which:

FIG. 1 depicts a block diagram of a LC voltage-oscillator according to the present invention, FIG. 2 depicts a more detailed block diagram of the LC oscillator, according to the present invention, FIG. 3 depicts the circuit of the LC tank circuit, according to an embodiment of the present invention, FIG. 4 depicts the equivalent open-loop circuit of the LC oscillator according to the present invention, FIG. 5 depicts a transistor level implementation of the invention according to the present invention, and FIG. 6 depicts a phase locked loop for a TV tuner according to the present invention.

FIG. 1 depicts a block diagram of a voltage-controlled LC oscillator according to the present invention. The voltage-controlled oscillator comprises a LC tank circuit L, C, R coupled to modulator means 2. The modulator means 2 are coupled to amplifier means 1 via an adder 3 for generating a quadrature periodical output signal having a frequency in a relative wide range, the frequency being controlled by a control signal $V_T$ provided to the modulator means 2. The LC tank circuit has a resonance frequency that determines an oscillation frequency of the oscillator that could be modified either by modifying a capacity in the LC tank circuit and/or by the control signal $V_T$ provided to the modulator means 2. The LC tank circuit comprises a series connection of an inductor L and a resistor R coupled in parallel to a capacitor C. When relatively high oscillation frequencies are generated e.g. GHz the inductor L has a relatively high quality factor and a voltage across the resistor $V_R$ is in quadrature with respect a voltage across the LC tank circuit $V_O$ and therefore the oscillator generates quadrature signals. A feedback signal obtained via the adder is used for sustaining the oscillation of the oscillator.

The modulator means 2 may comprise a series coupling of a buffer 20 and a modulator 21, as shown in FIG. 2. The buffer 20 has normally relatively high input impedance and therefore isolates the LC tank circuit from the modulator 21. Hence, the modulator 21 does not influence quality factor of the LC tank circuit and therefore its resonance frequency. The modulator is a Gilbert type modulator. Gilbert type modulators are frequently used in frequency modulation systems. Basically, the Gilbert type modulators output signals are currents and therefore the modulators are suitable to be used in relatively high frequency systems wherein current-type signals are easier to be used. Whenever it is possible, a relatively high input impedance buffer 20 is provided for better isolating the LC tank circuit from the rest of the circuits. Hence, both the LC tank circuit and the modulator 2 work in more relaxed conditions in terms of currents and voltages. When relatively high frequencies are generated, the amplifier 11 could be a transconductance amplifier. Transconductance amplifiers amplify a voltage-type input signal and generate a current-type output signal. Current-type signals are very suitable to be used in relatively high frequency systems a therefore a transconductance amplifier may be used in high frequency signals generation. In FIG. 2 it is considered that the amplifier 11 is a transconductance amplifier and the modulator 21 is a Gilbert modulator. Hence, the adder 3 is a node and the oscillator has a relatively simple structure.

The LC tank circuit may be modeled as in FIG. 3. In FIG. 3 the feedback current is denoted as I. The following notations are made:

$$Z_1 = sL + R$$

$$Z_2 = \frac{1}{sC}$$

wherein s is the complex frequency.

Let's express $V_R$ versus $V_O$:

$$V_O = I \cdot Z_1 // Z_2 = I \cdot \frac{Z_1 Z_2}{Z_1 + Z_2}$$

The two branch currents $I_1$ and $I_2$ are given below:

$$I_1 = I \cdot \frac{Z_2}{Z_1 + Z_2}$$

$$I_2 = I \cdot \frac{Z_1}{Z_1 + Z_2}$$

It follows:

$$V_R = I_1 \cdot R = I \cdot \frac{Z_2}{Z_1 + Z_2} \cdot R = \frac{V_O}{Z_1} \cdot R$$

$Z_1$ can be approximated as $Z_1 = R + j\omega L \approx j\omega L$ when the quality factor of the inductor L is much larger than one, meaning that:

$$R \ll \omega L$$

and therefore, $$Q_L = \frac{\omega L}{R} \gg 1$$

where $Q_L$ is the quality factor of the inductor L.

In practice of relatively high frequency systems i.e. GHz, the quality factor of the inductor L is much larger than one, so this approximation is valid, resulting that the voltage across the resistor R is:

$$V_R = \frac{V_O}{j\omega L} R = -j \frac{V_O}{\omega L} \cdot R = -j \frac{V_O}{Q_L}$$

In conclusion the voltage $V_R$ is in quadrature with $V_O$. This can be modeled with a stage having a gain equal to 1/Q and a phase shifter having a phase shift equal to $$-\frac{\pi}{2}$$

as shown FIG. 4. Using this figure we may calculate the open loop gain, the oscillation frequency and the oscillation condition of the oscillator.

Denote $$Z_{RLC} = \frac{sL}{s^2 LC + sLG_p + 1} \text{ and } G_p = \frac{1}{R_p}$$

the loss conductance of the LC tank circuit.

The total current $I_{OUT}$ of the LC tank circuit is given by $$I_{out} = V_i \cdot \left( G + \frac{k \cdot V_T}{Q} \cdot e^{-j\frac{\pi}{2}} \right)$$

and $$V_O = -V_i \cdot \left( G + \frac{k \cdot V_T}{Q} \cdot e^{-j\frac{\pi}{2}} \right) \cdot \frac{sL}{s^2 LC + sLG_p + 1}$$

The open-loop gain of the oscillator becomes:

$$A\beta = \frac{V_O}{V_i} = -\left( G + \frac{k \cdot V_T}{Q} \cdot e^{-j\frac{\pi}{2}} \right) \frac{j\omega L}{(1 - \omega^2 LC) + j\omega L G_p}$$

-continued or $$A\beta = -\frac{\frac{k \cdot V_T}{Q}\omega L + j\omega LG}{(1 - \omega^2 LC) + j\omega LG_p}$$

The oscillation condition is $A\beta=-1$. This means that $|A\beta|=1$ and $\phi(A\beta)=\pi$. We may compute now the phase of the open loop transfer $\phi(A\beta)$ and the phase condition for sustained oscillations:

$$\varphi\left(A\beta A = \pi + \arctan\left(\frac{QG}{k \cdot V_T}\right) - \arctan\left(\frac{\omega LG_p}{1-\omega^2 LC}\right)\right) = \pi$$

This yields the following condition:

$$\arctan\left(\frac{\frac{QG}{k \cdot V_T} - \frac{\omega LG_p}{1-\omega^2 LC}}{1 + \frac{QG \cdot \omega LG_p}{k \cdot V_T(1-\omega^2 LC)}}\right) = 0$$

which is reduced to a second order equation:

$$LCQG\omega^2 + kV_T LG_p \omega - GQ = 0$$

$$\omega_0 = \frac{\sqrt{4LCG^2Q^2}\left(\sqrt{1 + \frac{k^2V_T^2LG_p^2}{4CG^2Q^2}} - \frac{kV_T LG_p}{2\sqrt{LC}\,GQ}\right)}{2LCGQ}$$

We may approximate $$\sqrt{1+X} \approx 1 + \frac{X}{2},$$

when X is much smaller than 1, where $$X = \frac{k^2 V_T^2 LG_p^2}{4CG^2Q^2}$$

with Q being much larger than one.

$$\omega_o \approx \frac{1}{\sqrt{LC}}\left[1 + \frac{k^2V_T^2LG_p^2}{8CG^2Q^2} - \frac{kV_T LG_p}{2\sqrt{LC}\,GQ}\right]$$

However $$\frac{k^2V_T^2LG_p^2}{8CG^2Q^2}$$

is negligible compared to $$\frac{kV_T LG_p}{2\sqrt{LC}\,GQ}$$

for small tuning voltages. Hence, the oscillation frequency can be approximated with:

$$\omega_o \approx \frac{1}{\sqrt{LC}}\left[1 - \frac{kV_T G_p}{2GQ}\sqrt{\frac{L}{C}}\right]$$

In the above-expression $V_T$ has a bigger effect on the oscillation frequency to $\omega_0$ than the capacitance of the LC tank circuit. Therefore, $V_T$ may be used for coarse tuning and a varicap diode parallel on the LC tank for fine-tuning. This circuit can be used for large tuning range applications. The series resistors R could have a resistance of 10 ohms when the tuning range is one octave i.e. from a frequency $f_0$ to a frequency $2f_0$. The quadrature outputs $V_O$ and $V_R$ are buffered and amplified in order to produce sufficient power to drive the next stages.

FIG. 5 depicts a transistor level implementation of the invention according to the present invention. A CMOS implementation of the circuit shown in FIG. 5 is also possible and a skilled person in the art could easily implement it. Referring to FIG. 5, the LC tank circuit is differentially connected to the active part of the circuit. The transistors Q7, Q8 are differential buffer 20 and the transistors Q9, Q10 are buffer 10. They are used to decrease the loading effect of the LC tank circuit with the active part, modulator 21 and amplifier 11 of the circuit. The transistors Q11, Q12 and the current source $I_T$ represent the transconductance amplifier 11. It is connected in a positive feedback manner corresponding to the circuit shown in FIG. 1. The modulator 21 is implemented with transistors Q1, Q2, Q3, Q4, Q5 and Q6. The coarse tuning port C is denoted with VT+ and VT−.

FIG. 6 depicts a phase locked loop for a TV tuner according to the present invention. The large tuning range VCO is also employed in PLL circuits where the quadrature outputs are not always required. However, in zero-IF and low-IF applications the quadrature outputs are mandatory. In low-IF architectures, for cable-TV and terrestrial TV there is a need to cover a large number of bands and that is why the need for large tuning range oscillators or switched oscillators. In the last approach the number of oscillators reduces to about 4 to 5. Since the coarse tuning in FIG. 6 is differential, the gain of the VCO can be halved and therefore the differential tuning port of the VCO is less sensitive to common-mode noise and substrate noise. The gain of the VCO is relative high and therefore the loop should be adapted accordingly. To reduce more the sensitivity of the VCO, digital-tuning techniques may be used. They are based on A/D and D/A converters to decrease the slope of the gain when the VCO is in frequency lock. A possible implementation in a PLL loop with less sensitivity towards perturbations is shown in FIG. 6. The PLL consists of a phase-frequency detector PFD and two paths: a proportional path and an integral path. The integral path applied on the differential coarse tuning-port C of the VCO has a pure integrator LPF1 in the loop ensuring filtering of the high frequency noise coming from the charge-pump and PLL loop. The proportional path has a low-pass filter LPF2 used to drive the FME tuning-port of the VCO. The VCO will be locked in phase and frequency to the crystal XTAL. The window detect block WD detects the frequency-lock condition and interrupts the signal coming from the PFD on the integral part using the logic functions in the LOGIC block. The octave divider OD has only dividers by two blocks and performs the octave selection function. The quadrature outputs of the frequency divider may be used for the I/Q down-conversion for a low-IF, zero-IF receiver. The other blocks of the phase locked loop are known per se as the frequency divider M, charge pumps CP1, CP2 and the logic that controls the transfer of the phase-frequency detector PFD to the Charge pumps CP1, CP2.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. For generating a quadrature periodical output signal adjustable to frequencies in a relative wide range, a voltage controlled oscillator comprising a LC tank circuit coupled to modulator means for controlling an oscillation frequency of the LC tank circuit in response to a control signal and coupled to amplifier means via an adder, the adder providing feedback to the LC tank circuit, wherein the adder adds a signal from the amplifier means and a signal from the modulator means to provide the feedback and wherein the modulator means receives a signal from a first node of the LC tank circuit and the amplifier means receives a signal from a second node of the LC tank circuit.

2. An oscillator as claimed in claim 1, wherein the modulator means comprises a series coupling of a buffer and a modulator.

3. An oscillator as claimed in claim 1, wherein the amplifier means comprise a series coupling of a buffer and an amplifier.

4. An oscillator as claimed in claim 3, wherein the amplifier is a transconductance amplifier.

5. An oscillator as claimed in claim 1, wherein the amplifier means is a transconductance amplifier, the modulator means is a Gilbert cell modulator and the adder is a node.

6. A phase locked loop comprising an oscillator as claimed in claim 1 for use in a large tuning TV tuner.

7. For use with an LC-type tank circuit having an inductive current path and a capacitive current path, a method for generating a quadrature periodical output signal adjustable to frequencies in a relative wide range, the method comprising:

from a first high-impedance node, generating a first buffered signal indicative of a level of current through the inductive pat of the LC-type tank circuit;

from a second high-impedance node, generating a second buffered signal indicative of a level of current through the capacitive path of the LC-type tank circuit;

in response to a control signal, quadrature modulating the first buffered signal and producing a modulated signal therefrom;

amplifying the second buffered signal and producing an amplified signal therefrom; and adding the modulated signal and the amplified signal and, in response thereto, providing a feedback signal to the LC tank circuit.

8. The method of claim 7, wherein the step of amplifying uses a transconductance amplifier.

9. The method of claim 7, further including the step of using a phase-locked-loop circuit to control the periodic output signal.

10. The method of claim 9, wherein the periodic output signal is used in a TV tuner.

11. For use with an LC-type Lank circuit having an inductive current path and a capacitive current path, an arrangement for generating a quadrature periodical output signal adjustable to frequencies in a relative wide range, the arrangement comprising:

first high-impedance node means for generating a first buffered signal indicative of a level of current through the inductive path of the LC-type tank circuit;

second high-impedance node means for generating a second buffered signal indicative of a level of current through the capacitive path of the LC-type tank circuit;

means, responsive to a control signal, for quadrature modulating the first buffered signal and producing a modulated signal therefrom;

means for amplifying the second buffered signal and producing an amplified signal therefrom; and means for adding the modulated signal and the amplified signal and, in response thereto, providing a feedback signal to the LC tank circuit.

12. For use with an LC-type tank circuit having an inductive current path and a capacitive current path, an arrangement for generating a quadrature periodical output signal adjustable to frequencies in a relative wide range, the arrangement comprising:

first high-impedance node circuit to generate a first buffered signal indicative of a level of current through the inductive path of the LC-type tank circuit;

second high-impedance node circuit to generate a second buffered signal indicative of a level of current though the capacitive path of the LC-type tank circuit;

a quadrature modulator to, in response to a control signal, quadrature modulate the first buffered signal and produce a modulated signal therefrom;

an amplifier to amplify the second buffered signal, thereby producing an amplified signal; and a circuit to add the modulated signal and the amplified signal and, in response thereto, and to provide a feedback signal to the LC tank circuit.

13. The arrangement of claim 12, wherein the amplifier is a transconductance amplifier.

14. The arrangement of claim 12, further including a phase-lacked-loop circuit to control the periodic output signal.

15. The arrangement of claim 14, further including a TV tuner to facilitate tuning.

* * * * *